(12) United States Patent
Lou

(10) Patent No.: US 6,274,497 B1
(45) Date of Patent: Aug. 14, 2001

(54) COPPER DAMASCENE MANUFACTURING PROCESS

(75) Inventor: Chine-Gie Lou, Hsinchu Hsien (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/499,067

(22) Filed: Feb. 4, 2000

(30) Foreign Application Priority Data

Nov. 25, 1999 (TW) .............................................. 088120586

(51) Int. Cl.$^7$ ..................................................... H01L 21/44
(52) U.S. Cl. ......................... 438/687; 438/675; 438/638; 438/647
(58) Field of Search .................................... 438/687, 638, 438/637, 639, 641, 647, 678, 675, 674

(56) References Cited

U.S. PATENT DOCUMENTS

| 6,080,656 | * | 6/2000 | Shih et al. ............................ 438/626 |
| 6,136,707 | * | 10/2000 | Cohen .................................. 438/687 |
| 6,153,528 | * | 11/2000 | Lan ...................................... 438/697 |
| 6,156,655 | * | 12/2000 | Huang et al. ........................ 438/687 |

FOREIGN PATENT DOCUMENTS

| 1077485-A2 | * | 2/2001 | (EP) . |
| 2794286-A1 | * | 12/2000 | (FR) . |
| 1098011 | * | 4/1998 | (JP) . |
| 2000174027 | * | 6/2000 | (JP) . |
| WO-00/04573 | * | 1/2000 | (WO) . |

* cited by examiner

Primary Examiner—Tuan H. Nguyen
(74) Attorney, Agent, or Firm—Jiawei Huang; J.C. Patents

(57) ABSTRACT

A copper damascene process for forming copper plugs. A conductive structure that includes an amorphous silicon layer and a metal line is formed over a substrate. A dielectric liner layer is formed over the conductive structure and the substrate. A multi-level dielectric layer is formed over the dielectric liner layer, then the multi-level dielectric layer and dielectric liner layer are patterned to form a via that exposes a portion of the amorphous silicon layer on the conductive line. Metal barrier spacers are formed on the sidewalls of the via. A copper displacement process is next carried out to convert the amorphous silicon layer into a first copper layer. Since a portion of the metal barrier spacers is also converted into a second copper layer. a process is carried out to remove the second copper layer from the metal barrier spacers. Using the first copper layer as a seeding layer, a copper electroless plating is carried out. Copper is accumulated from the bottom of the via anisotropically so that a copper plug is ultimately formed inside the via.

17 Claims, 5 Drawing Sheets

COPPER DAMASCENE MANUFACTURING PROCESS

CROSS-REFERENCE TO RELATED APPLICATION

This application claims the priority benefit of Taiwan application serial no. 88120586, filed Nov. 25, 1999.

BACKGROUND OF THE INVENTION

1. Field of the Invention

The present invention relates to a method of manufacturing the multi-level metallic interconnect (MLM) of a semiconductor device. More particularly, the present invention relates to a copper damascene manufacturing process.

2. Description of Related Art

To keep up with the manufacturing cost, deep-submicron devices are now being manufactured. A variety of advanced materials are also employed to increase device operation speed and improve device reliability.

In the backend production of semiconductor devices, current density loading of metal lines is greatly increased due to the large reduction in metal line width. Since aluminum provides little resistance against electromigration, conventional aluminum metal lines are increasingly affected by electromigration problems. Consequently, device reliability will deteriorate if the use of aluminum lines is continued.

To resolve the problems resulting from fabricating deep submicron devices, choosing a metal with a small electromigration such as copper is important. However, copper is a metal that resists the etching action of most conventional gaseous etchants so that copper lines and copper plugs simply cannot be fabricated by a conventional method. Hence, a damascene process must be used instead.

FIGS. 1A through 1F are schematic cross-sectional views showing the progression of steps in a conventional copper damascene process for producing a copper line and a copper plug.

As shown in FIG. 1A, a silicon oxide layer 102 is formed over a substrate 100. A silicon nitride layer 104 is formed over the silicon oxide layer 102, and then another silicon oxide layer 106 is formed over the silicon nitride layer 104. The silicon oxide layer 102, the silicon nitride layer 104 and the silicon oxide layer 106 can be formed by plasma-enhanced chemical vapor deposition (PECVD), and the layers together serve as an inter-metal dielectric (IMD) layer.

As shown in FIG. 1B, photolithographic and etching techniques are used to form a trench line 108 in the silicon oxide layer 106. The silicon nitride layer 104 serves as an etching stop layer when the trench line 108 is formed so that over-etching is prevented.

As shown in FIG. 1C, again using photolithographic and etching techniques, the silicon nitride layer 104 and the silicon oxide layer 102 at the bottom of the trench line 108 are etched to form a via 110.

As shown in FIG. 1D, a metal barrier layer 112 and a copper layer 114 are sequentially formed conformal to the profile of the trench line 108, the via 110 and the silicon oxide layer 106. The metal barrier layer 112 and the copper layer 114 can be formed, for example, by physical vapor deposition (PVD) or chemical vapor deposition (CVD).

As shown in FIG. 1E, using the copper layer 114 as a seeding layer, copper electroplating is carried out to form a second copper layer 116 over the copper layer 114.

As shown in FIG. 1F, a portion of the metal barrier layer 112, the copper layers 114 and 116 are removed. Ultimately, only a metal barrier layer 112a, copper layers 114a and 116a are retained inside the trench line 108 and the via 110. The metal barrier layer 112, the copper layers 114 and 116 above the silicon oxide layer 106 can be removed by chemical-mechanical polishing (CMP).

As the dimensions of a device shrink, forming a conformal metal barrier layer and a conformal copper seeding layer inside the trench line 108 and the via 110 is becoming harder. This is because of the difficulty in depositing a uniform layer inside an opening having a high aspect ratio (HAR). In addition, forming a copper plug in an opening with a high aspect ratio is likely to result in the formation of a void or a seam in the center of the plug. To form a seeding layer of copper, special copper machines for physical or chemical vapor deposition has to be used. Ultimately, production cost is likely to increase.

SUMMARY OF THE INVENTION

Accordingly, one object of the present invention is to provide a copper damascene process capable of producing a copper plug without the need for special copper machines. In addition, a void and seam free copper plug can be formed inside the via.

To achieve these and other advantages and in accordance with the purpose of the invention, as embodied and broadly described herein, the invention provides a copper damascene process for forming copper plugs. A substrate is provided, and then a conductive structure is formed over the substrate. The conductive structure is a stack that includes an amorphous silicon layer and a metal line, with the amorphous silicon layer sitting on top of the metal line. A dielectric liner layer is formed over the conductive structure and the substrate. A first dielectric layer is formed over the dielectric liner layer, and then a dielectric cap layer is formed over the first dielectric layer. A second dielectric layer is next formed over the dielectric cap layer. The second dielectric layer, the dielectric cap layer, the first dielectric layer and the dielectric liner layer are patterned to form a via. The via exposes a portion of the silicon layer of the conductive structure. Metal barrier spacers are formed on the sidewalls of the via. A copper displacement process is conducted to convert the amorphous silicon layer into a first copper layer. Meanwhile, a portion of the metal barrier spacers is converted into a second copper layer. The second copper layer above the metal barrier spacers is subsequently removed. Using the first copper layer as a seeding layer, a copper electroless plating is carried out to form a copper plug inside the via.

In this invention, a conductive line having an amorphous silicon layer thereon is first formed over a substrate. A multi-level metallic (MLM) layer dielectric is then formed over the conductive line. The MLM dielectric layer is patterned to form a via that exposes a portion of the dielectric silicon layer on the conductive line. Metal barrier spacers are next formed on the sidewalls of the via. A copper displacement process is carried out replacing the dielectric silicon layer on top of the conductive line by a copper layer. Redundant copper on top of the metal barrier spacers is removed. Using the replaced copper layer above the conductive line as a seeding layer, a copper electronless plating is carried out depositing copper anisotropically into the via to form a copper plug.

The copper plug inside the via is formed by an anisotropic growth process starting from the bottom of the via. Thus, even when dimensions of device are reduced to create a high aspect ratio structural opening, no residual void or seam will form in the middle of the copper plug.

In addition, the copper damascene process of this invention can be carried out without using special copper machines for physical or chemical vapor deposition. Production cost thus can be lowered.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
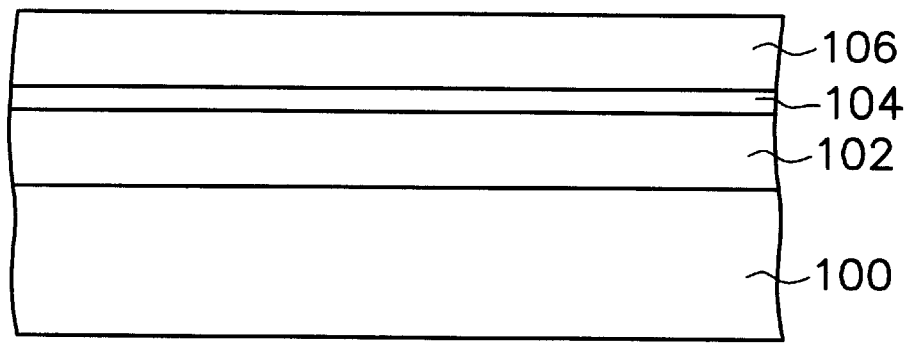
FIGS. 1A through 1F are schematic cross-sectional views showing the progression of steps in a conventional copper damascene process for producing a copper line and a copper plug.
Figure 1B:
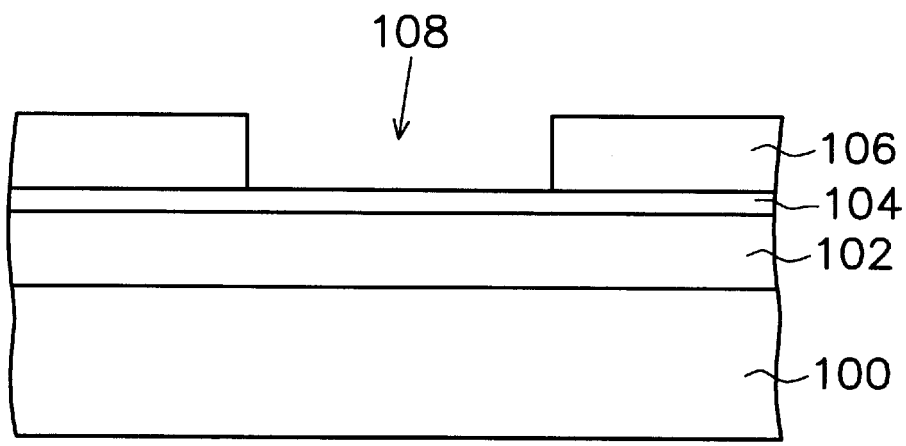
Figure 1C:
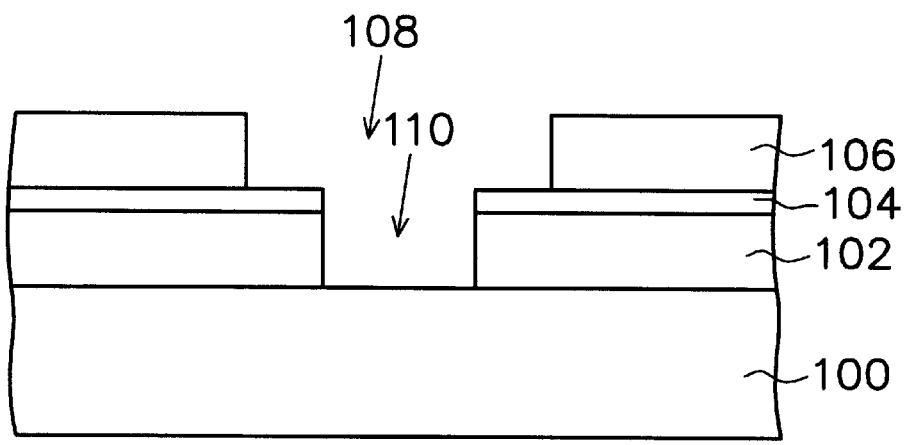
Figure 1D:
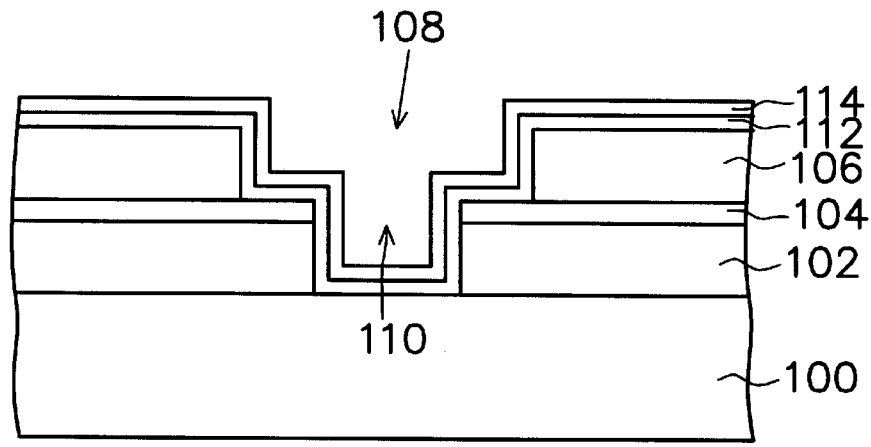
Figure 1E:
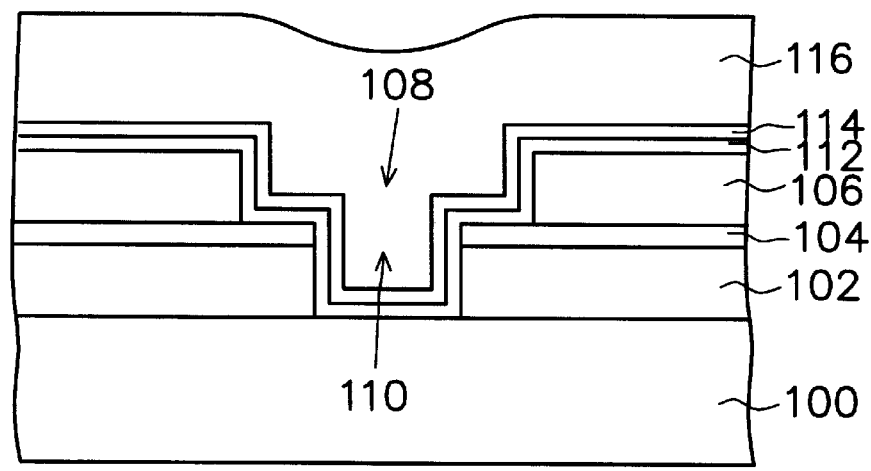
Figure 1F:
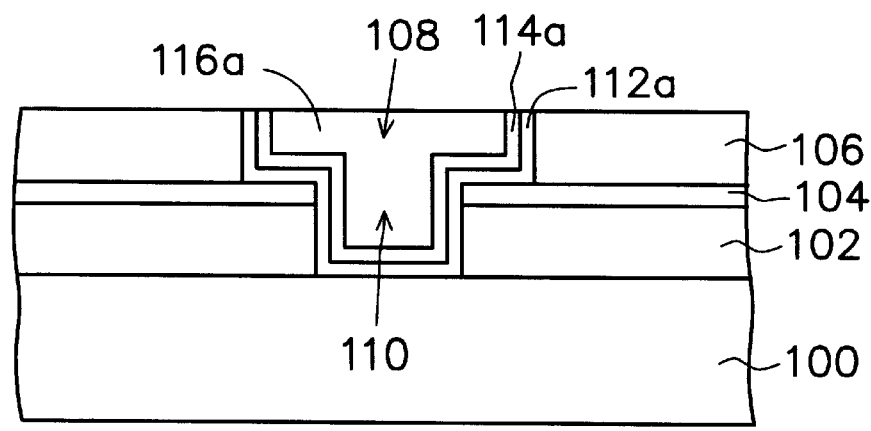

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2F are schematic cross-sectional views showing the progression of steps for producing a copper plug according to the copper damascene process of this invention.

Figure 2A:
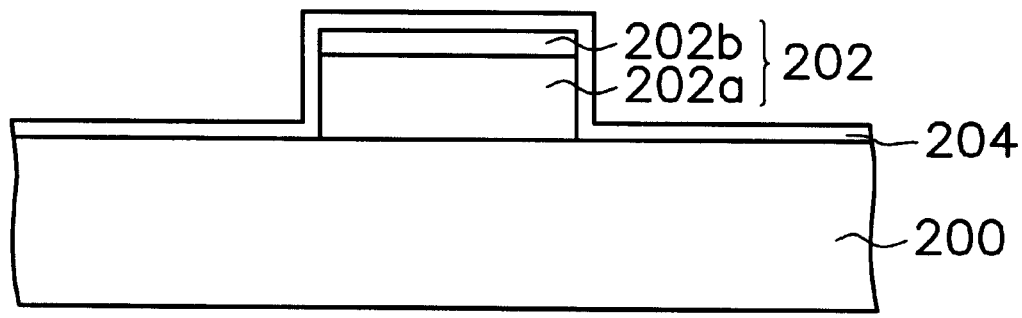
FIGS. 2A through 2F are schematic cross-sectional views showing the progression of steps for producing a copper plug according to the copper damascene process of this invention.

As shown in FIG. 2A, a metal layer and an amorphous silicon layer are sequentially formed over a substrate 200. The metal layer and the amorphous silicon layer are patterned to form a stacked conductive structure 202 that includes a metal line 202a and a silicon layer 202b. The metal line 202a can be formed, for example, by physical vapor deposition using aluminum-copper alloy. The amorphous silicon layer 202b can be formed, for example, by plasma-enhanced chemical vapor deposition (PECVD).

A dielectric liner layer 204 is formed over the conductive structure 202 and the substrate 200. The dielectric liner layer 204 is capable of stopping the diffusion of copper atoms and protecting the conductive structure 202 when an overlying copper layer is removed in wet etching. Therefore, the dielectric liner layer 204 is preferably a silicon nitride layer formed, for example, by plasma-enhanced chemical vapor deposition.

Figure 2B:
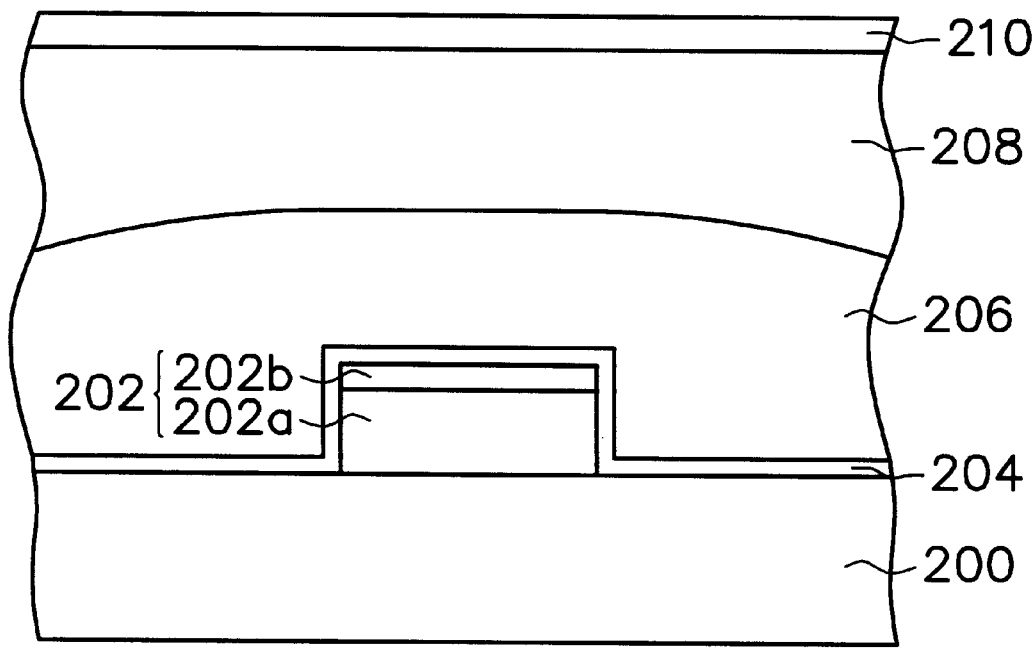

As shown in FIG. 2B, a dielectric layer 206 is formed over the dielectric liner layer 204. The dielectric layer 206 can be a silicon oxide layer or a low dielectric constant layer. In general, low dielectric constant material refers to the type of material having a dielectric constant lower than silicon oxide (having a dielectric constant of about 3.9). Low dielectric constant material includes organic substances such as polyimide, fluorinated polyimide, high molecular weight polymer, FLARE, or inorganic substances such as hydrogen silsesquioxane (HSQ) or methylsequioxane (MSQ). The organic or inorganic low dielectric constant material is typically formed using a spin-on-glass (SOG) method.

A dielectric cap layer 208 is formed over the dielectric layer 206. The dielectric cap layer 208 can be a silicon oxide layer formed, for example, by plasma-enhanced chemical vapor deposition. The dielectric cap layer 208 is planarized, for example, by chemical-mechanical polishing (CMP). Another dielectric layer 210 is formed over the dielectric cap layer 208. The function of the dielectric layer 210 is very similar to the dielectric liner layer 204. The dielectric layer 210 is capable of stopping the diffusion of copper atoms and protecting the underlying layer when an overlying copper layer is removed in wet etching. Hence, the dielectric layer 210 is preferably a silicon nitride layer formed, for example, by plasma-enhanced chemical vapor deposition.

Figure 2C:
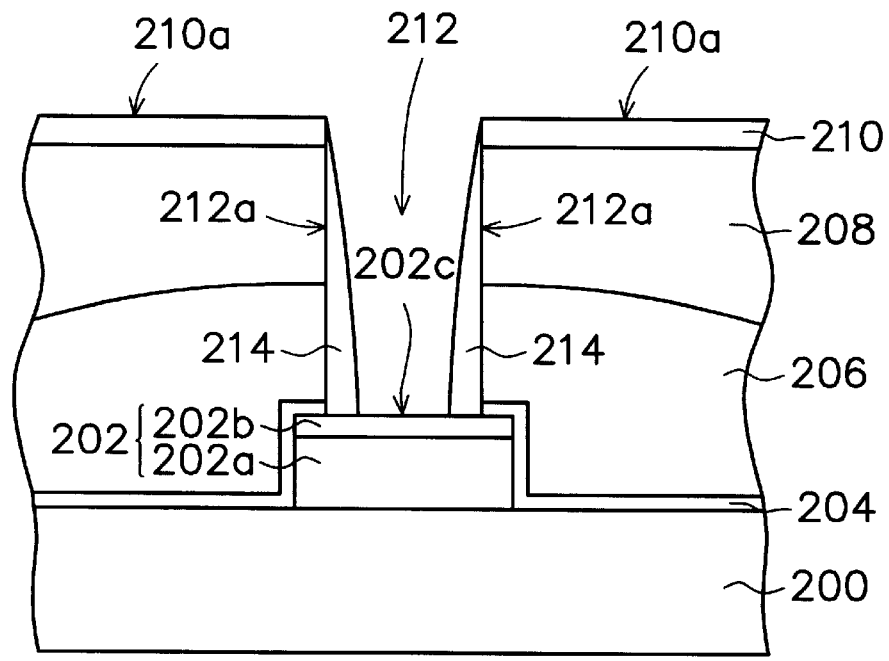

As shown in FIG. 2C, the dielectric layer 210, the dielectric cap layer 208, the dielectric layer 206 and the dielectric liner layer 204 are patterned to form a via 212 that exposes a top surface 202c of the amorphous silicon layer 202b. Metal barrier spacers 214 are formed on the sidewalls 212a of the via 212, for example, by depositing a metal barrier material over the dielectric layer 210, sidewalls 212a of the via 212 and the surface 202c of the amorphous silicon layer 202b, and then etching back the metal barrier material to remove metal barrier material above the surface 210a of the dielectric layer 210 and the top surface 202c of the amorphous silicon layer 202b. The metal barrier spacers 214 are typically composed from material such as titanium nitride (TiN), tungsten nitride (WN) or tantalum nitride (TaN). The preferred spacer material is tantalum nitride deposited by sputtering.

Figure 2D:
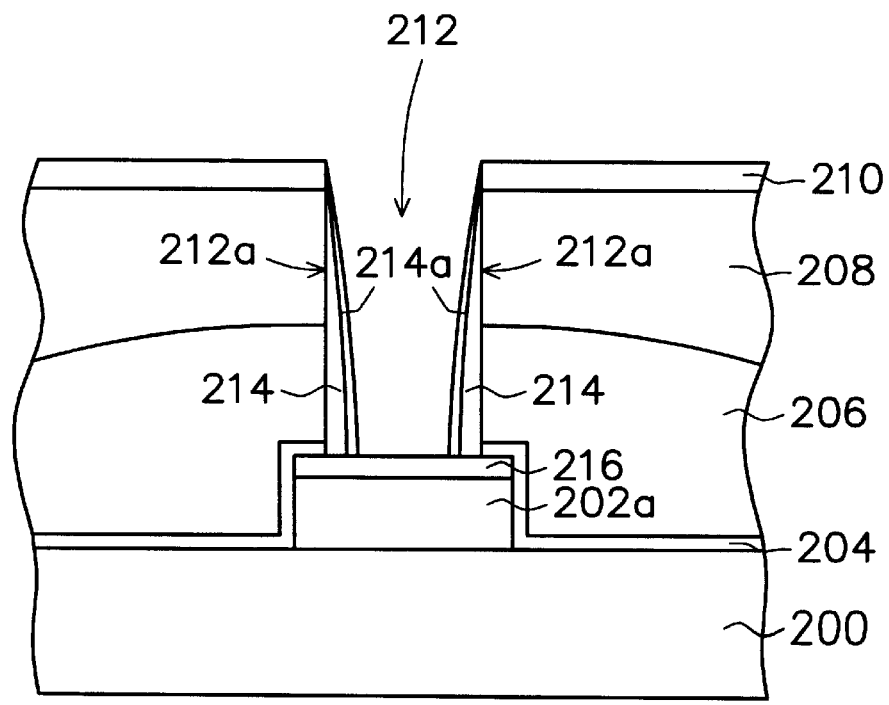

As shown in FIG. 2D, a copper displacement is carried out so that the amorphous silicon layer 202b is entirely replaced by a copper layer 216. Meanwhile, a portion of the spacer material on the metal barrier spacers 214 is also displaced, thereby forming a copper layer 214a over the metal barrier spacers 214. Copper displacement is conducted using a solution containing a buffered oxide etchant (BOE), de-ionized water and hydrated copper sulfate ($CuSO_4 \cdot 5H_2O$). Since the rate of displacement with the amorphous silicon layer 202b is much higher than the metal barrier spacers 214 (roughly 5 to 8 times faster), only a portion of the metal barrier spacers 214 will be displaced after the complete displacement of the amorphous silicon layer 202b. Consequently, the copper layer 214a on the metal barrier spacers 214 is thin.

Figure 2E:
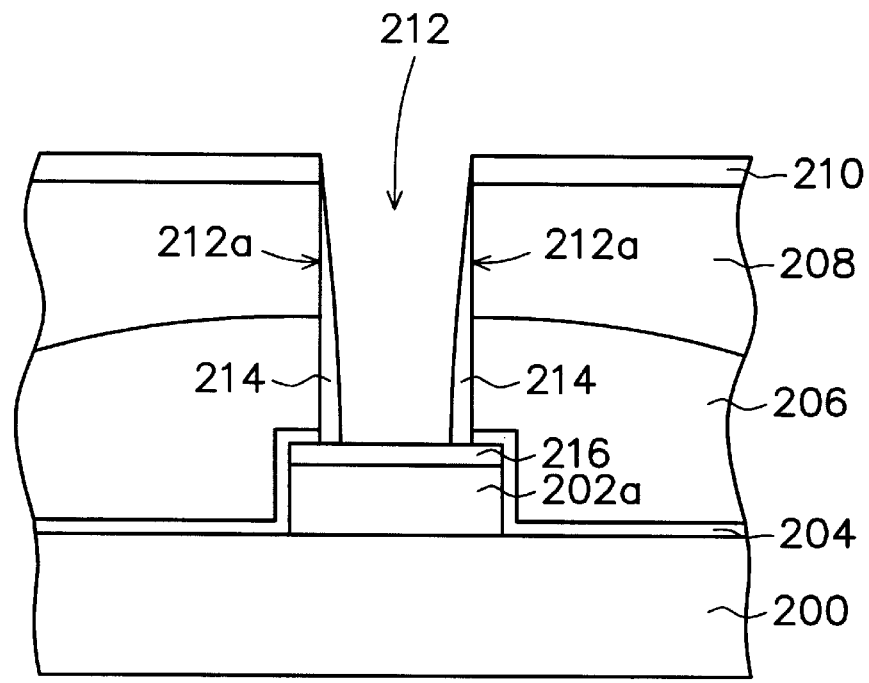

As shown in FIG. 2E, the copper layer 214a above the metal barrier spacers 214 is removed, for example, by wet etching using etchant such as dilute hydrofluoric acid (DHF) or ammonia ($NH_4OH$). The hydrofluoric acid can be diluted using de-ionized water in a ratio of roughly 1:300. A portion of the copper in the copper layer 216 will also be removed by the etchants when the copper layer 214a is removed. However, since the copper layer 214a is rather thin while the copper layer 216 is relatively thick (thickness depends on the amorphous silicon layer 202b), loss in thickness for the copper layer 216 can be neglected. In addition, since the device is entirely enclosed by protective layers including the dielectric liner layer 204, the dielectric layer 210 and the metal barrier spacers 214, the process of removing the copper layer 214a by etchants will not produce any damages.

Figure 2F:
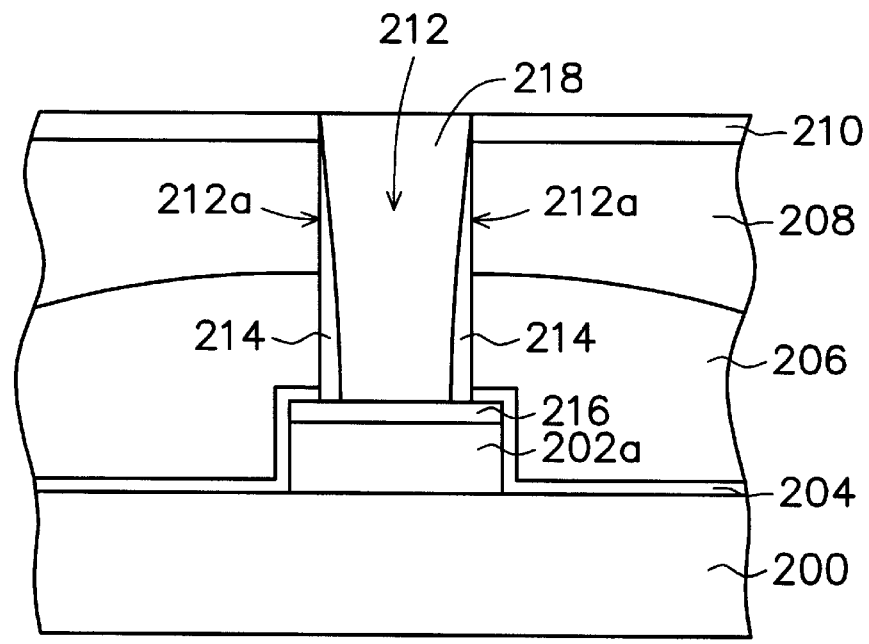

As shown in FIG. 2F, using the copper layer 216 as a seeding layer, a copper electroless plating is carried out to form a copper plug 218 inside the via 212. Because the copper layer 216 at the bottom of the via 212 can provide a seeding stage for copper electroless plating, the copper plug 218 is formed by anisotropic growth from the bottom of the via 212.

After the formation of the copper plug 218, a planarization operation such as a chemical-mechanical polishing can be carried out to remove any copper material above the dielectric layer 210.

In this invention, a conductive line having an amorphous silicon layer thereon is first formed over a substrate. A multi-level metallic dielectric layer is then formed over the conductive line. The MLM dielectric layer is patterned to form a via that exposes a portion of the amorphous silicon layer on the conductive line. Metal barrier pacers are next formed on the sidewalls of the via. A copper displacement process is carried out replacing the amorphous silicon layer on top of the conductive line by a copper layer. Redundant copper on top of the metal barrier spacers is removed. Using the replaced copper layer above the conductive line as a seeding layer, a copper electroless plating is carried out depositing copper anisotropically into the via to form a copper plug.

The copper plug inside the via is formed by an anisotropic growth process starting from the bottom of the via. Thus, even when dimensions of device are reduced to create a high aspect ratio structural opening, no residual void or seam will form in the middle of the copper plug.

In addition, the copper damascene process of this invention can be carried out without using special copper machines for physical or chemical vapor deposition. Production cost thus can be lowered.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A copper damascene process, comprising the steps of:
   providing a substrate;
   forming a conductive structure over the substrate, wherein the conductive structure is a stack composing of an amorphous silicon layer over a metal line;
   forming a dielectric liner layer over the conductive structure and the substrate;
   forming a first dielectric layer over the dielectric liner layer;
   forming a dielectric cap layer over the first dielectric layer;
   forming a second dielectric layer over the dielectric cap layer;
   patterning the second dielectric layer, the dielectric cap layer, the first dielectric layer and the dielectric liner layer to form a via that exposes a portion of the amorphous silicon layer of the conductive structure;
   forming metal barrier spacers on the sidewalls of the via;
   performing a copper displacement operation so that the amorphous silicon layer is replaced by a first copper layer and a portion of the metal barrier spacers is replaced by a second copper layer;
   removing the second copper layer above the metal barrier spacers; and
   performing a copper electroless plating using the first copper layer as a seeding layer to form a copper plug inside the via.

2. The process of claim 1, wherein the step of forming the amorphous silicon layer by plasma enhanced chemical vapor deposition.

3. The process of claim 1, wherein the step of forming the dielectric liner layer and the step of forming the second dielectric layer include depositing silicon nitride.

4. The process of claim 1, wherein the first dielectric layer is formed using a material that has a low dielectric constant.

5. The process of claim 1, wherein the step of forming the dielectric cap layer includes depositing silicon oxide.

6. The process of claim 1, wherein the step of forming the metal barrier spacers includes the substeps of:
   forming a metal barrier layer over the second dielectric layer, sidewalls of the via and the amorphous silicon layer; and
   etching to remove the metal barrier layer above the second dielectric layer and the amorphous silicon layer.

7. The process of claim 1, wherein the step of performing copper displacement includes using a solution that contains a buffered oxide etchant, de-ionized water and hydrated copper sulfate.

8. The process of claim 1, wherein the step of removing the second copper layer includes wet etching.

9. The process of claim 8, wherein the solution for wet etching the second copper layer includes diluted hydrofluoric acid.

10. The process of claim 8, wherein the solution for wet etching the second copper layer includes ammonia water.

11. A copper damascene process, comprising the steps of:
    providing a substrate;
    forming a metal layer over the substrate;
    forming an amorphous silicon layer over the metal layer;
    patterning the amorphous silicon layer and the metal layer to form a conductive structure above the substrate;
    forming a silicon nitride liner layer over the conductive structure and the substrate;
    forming a low dielectric constant layer over the silicon nitride liner layer;
    forming a dielectric cap layer over the low dielectric constant layer;
    forming a silicon nitride layer over the dielectric cap layer;
    patterning the silicon nitride layer, the dielectric cap layer, the low dielectric constant layer and the silicon nitride liner layer to form a via that exposes a portion of the amorphous silicon layer of the conductive structure;
    forming a metal barrier layer over the silicon nitride layer, sidewalls of the via and the amorphous silicon layer;
    etching to remove the metal barrier layer above the silicon nitride layer and the amorphous silicon layer to form metal barrier spacers on the sidewalls of the via;
    performing a copper displacement operation so that the amorphous silicon layer is replaced by a first copper layer and a portion of the metal barrier spacers is replaced by a second copper layer;
    removing the second copper layer above the metal barrier spacers; and
    performing a copper electroless plating using the first copper layer as a seeding layer to form a copper plug inside the via.

12. The process of claim 11, wherein the step of forming the dielectric cap layer includes depositing silicon oxide.

13. The process of claim 11, wherein the step of forming the metal barrier layer includes depositing titanium nitride.

14. The process of claim 11, wherein the step of performing copper displacement includes using a solution that contains a buffered oxide etchant, deionized water and hydrated copper sulfate.

15. The process of claim 11, wherein the step of removing the second copper layer includes wet etching.

16. The process of claim 15, wherein the solution for wet etching the second copper layer includes diluted hydrofluoric acid.

17. The process of claim 15, wherein the solution for wet etching the second copper layer includes ammonia water.

* * * * *